United States Patent [19]
Sandhu et al.

[11] Patent Number: 5,089,986
[45] Date of Patent: Feb. 18, 1992

[54] MUSHROOM DOUBLE STACKED CAPACITOR

[75] Inventors: Gurtej S. Sandhu; Pierre C. Fazan; Yauh-Ching Liu; Hiang C. Chan, all of Boise, Id.

[73] Assignee: Micron Technology, Inc., Boise, Id.

[21] Appl. No.: 637,108

[22] Filed: Jan. 2, 1991

[51] Int. Cl.⁵ .............................. G11C 11/24
[52] U.S. Cl. ...................... 365/149; 365/51; 365/189.01
[58] Field of Search ............ 365/51, 149, 182, 150, 365/189.01

[56] References Cited

U.S. PATENT DOCUMENTS 4,896,293  1/1990  McElroy .................... 365/149

OTHER PUBLICATIONS

"3-Dimensional Stacked Capacitor Cell for 16M and 64M DRAMs", by T. Ema et al., pp. 592-595.

"A Spread Stacked Capacitor (SSC) Cell for 64MBIT DRAMs", by S. Inoue et al., pp. 31-34, IEDM 89'.

Primary Examiner—Terrell W. Fears
Attorney, Agent, or Firm—David J. Paul

[57] ABSTRACT

A mushroom double stacked capacitor (mushroom cell) using a modified stacked capacitor storage cell fabrication process. The mushroom cell is made up of polysilicon structure, having a mushroom extended V-shaped cross-section. The storage node plate of the mushroom cell is overlaid by polysilicon with a dielectric sandwiched in between and connects to an access device's active area via a buried contact. The plate extends to an adjacent storage node but is isolated from the adjacent node by less than the critical resolution dimension of a given lithographic technology. The shape of the polysilicon structure increases storage capability 200% or more without enlarging the surface area defined for a normal buried digit line stacked capacitor cell.

3 Claims, 11 Drawing Sheets

MUSHROOM DOUBLE STACKED CAPACITOR

FIELD OF THE INVENTION

This invention relates to semiconductor circuit memory storage devices and more particularly to the design of three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown characteristics between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3-DIMENSIONAL STACKED CAPACITOR CELL FOR 16M AND 64M DRAMS," IEDM, Dig. Tech. Papers, pp. 592-595, 1988, herein incorporated by reference, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the polysilicon fins (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins making up the cell plate is much larger than minimum feature size. In addition, the process flow needed to realize this fin structure requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process by adding one photolithography step and one selective polysilicon deposition step to construct a three-dimensional stacked capacitor cell self-aligned to a buried contact.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional mushroom double stacked capacitor (referred throughout this embodiment as a mushroom cell) which defines a storage cell.

After a silicon wafer is prepared using conventional process steps, the present invention develops the mushroom cell by creating a V-shaped poly structure conforming to the topology formed by three adjacent word lines running perpendicular to two adjacent digit lines. The V-shaped poly structure is further developed by an addition of a mushroom-shaped poly structure connected to and extending upward from the center of the V-shaped poly structure. The completed poly structure takes on mushroom extended V-shaped cross-section that is used as a storage node cell plate which results in increased capacitor plate surface area for each storage cell. Such a structure has the potential to increase the capacitance of a conventional STC cell by 200% or more.

DETAILED DESCRIPTION OF THE PREFERRED EMBODIMENT

The invention is directed to maximizing storage cell surface area in a high density/high volume DRAM fabrication process, in a sequence shown in FIGS. 1-12.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. The active areas are used to form active MOS transistors that can be doped as NMOS or PMOS type FETs depending on the desired use.

Figure 1:
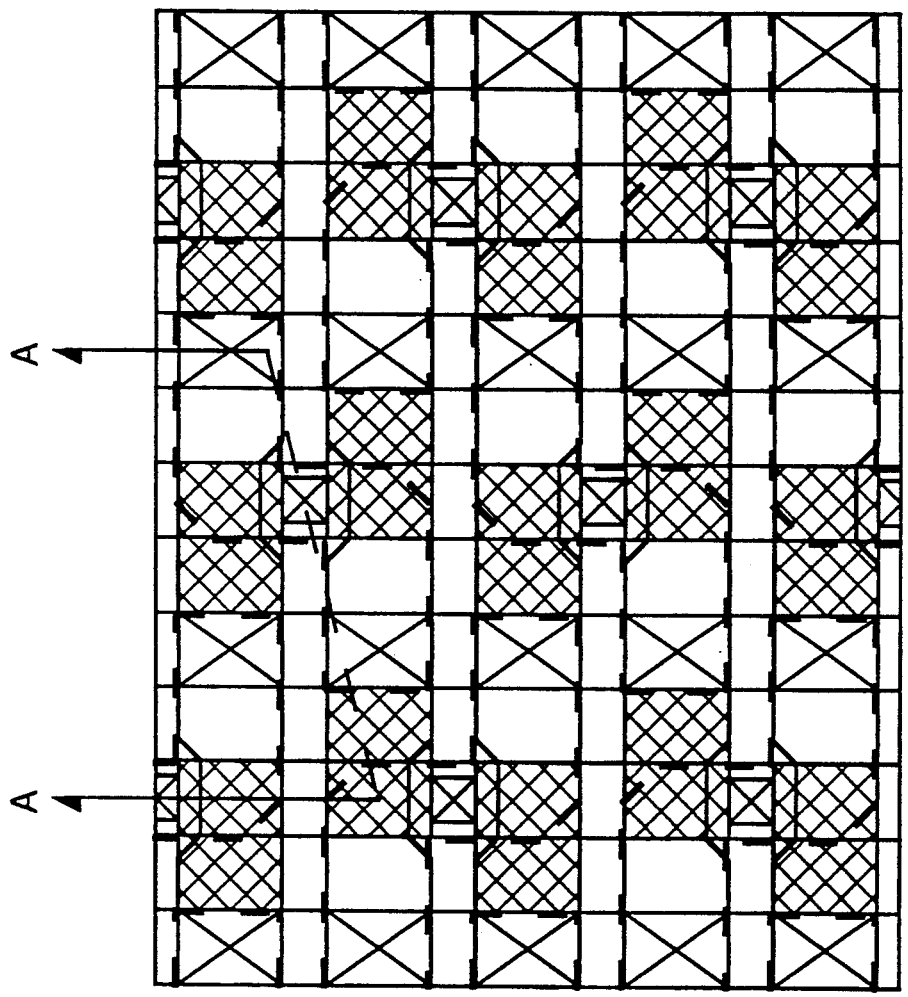
FIG. 1 is a top planar view of a portion of an inprocess wafer showing digit lines, word lines, active areas and storage capacitors.

FIG. 1 shows a top planar view portion of a completed multilayered memory array with the main building blocks comprising digit lines 42, word lines 22, active area 21, and a mushroom cell storage mode plate 61. Active areas 21 have been implanted in such a manner as to have each adjacent active area interweave with one another in the row direction (defined by parallel word lines 22) thereby forming parallel interdigitated rows of active areas 21. In the column direction (defined by parallel digit lines 42) each adjacent active area 21 run end to end thereby forming parallel non-interdigitated columns of active areas 21. The stacked capacitor structure of the preferred embodiment (the mushroom cell) is self-aligned to and over the top of word 42 lines as well as to digit lines 22.

Figure 2:
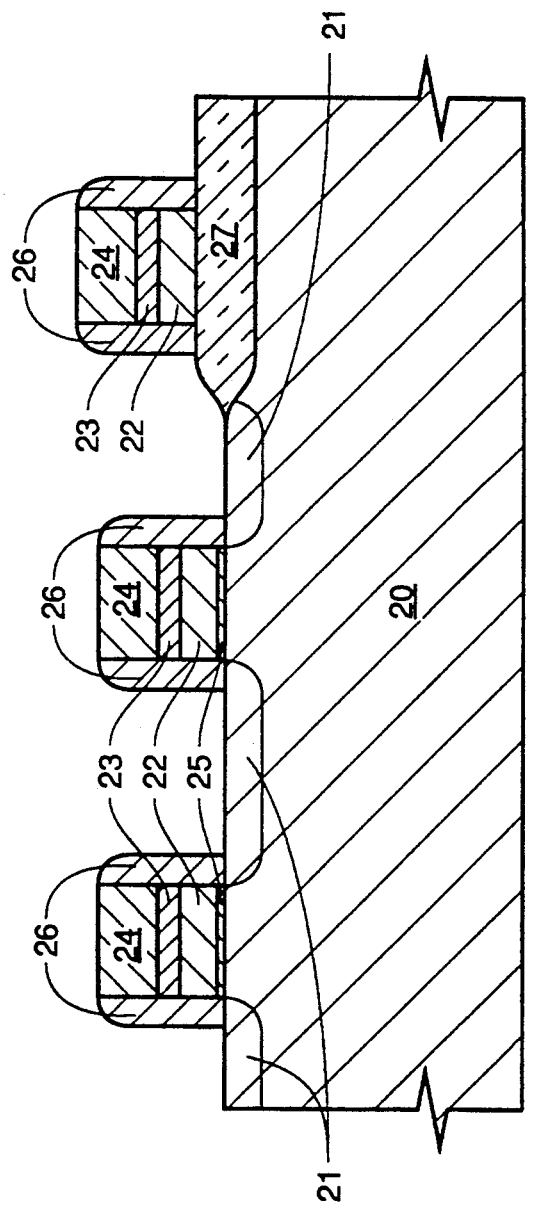
FIG. 2 is a cross-sectional view through broken line A—A of FIG. 1.

As shown in FIG. 2, parallel poly word lines 22, covered with silicide 23 and dielectric 24 (either oxide or nitride) and further isolated from subsequent conductive layers by dielectric spacers 26 (either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to word lines 22.

Figure 3:
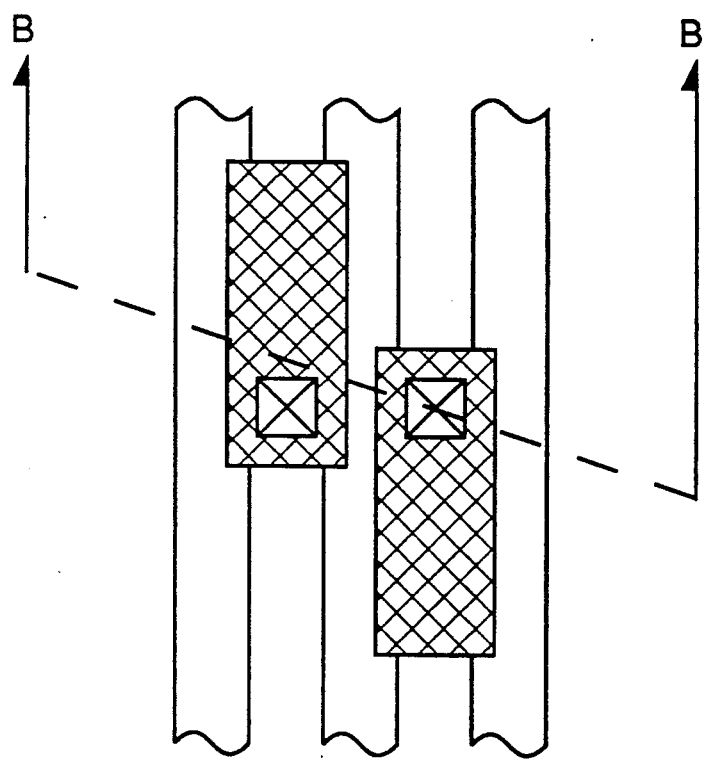
FIG. 3 is a top planar view of a portion of an inprocess wafer showing digit lines, storage node contacts and storage capacitors.

FIG. 3 shows a top planar view of a portion of an in-process wafer showing digit lines 42, storage node contacts 57, active area 21 and storage capacitors 61.

Figure 4:
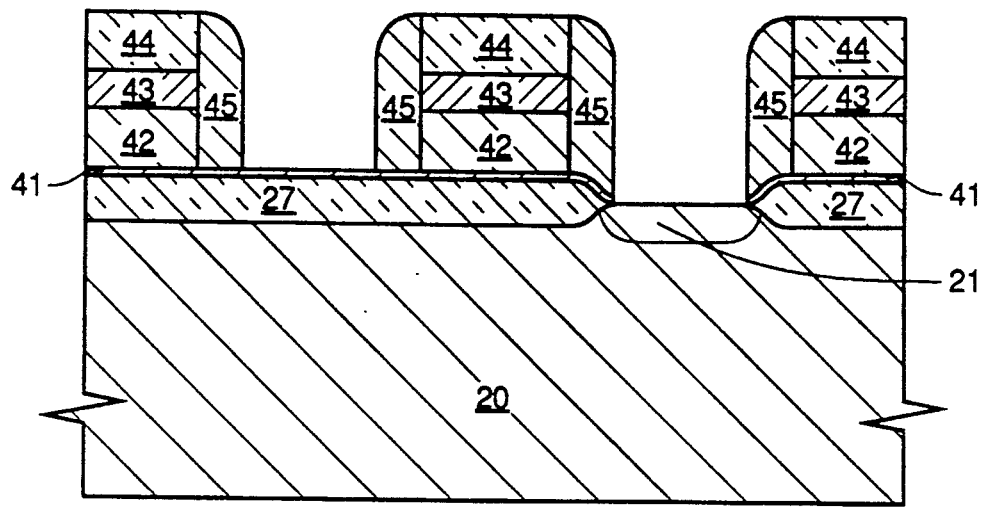
FIG. 4 is a cross-sectional view of the in-process wafer through broken line B—B of FIG. 3 following deposition an etching of digit line vertical dielectric spacers.

As shown in FIG. 4, an oxide layer 41 is deposited over the entire wafer array surface followed by buried digit line contacts patterning and etch. Blanket depositions of polysilicon 42, silicide 43 and dielectric 44 are performed, respectively. Dielectric 44 can be either nitride or oxide and is deposited by chemical vapor deposition (CVD) which is preferred for its excellent conformity. The layers of polysilicon 42, silicide 43 and dielectric 44 are patterned and etched with polysilicon 42, previously being conductively doped, in conjunction with silicide 43 to serve as parallel digit lines 42 covered with dielectric layer 44. Digit lines 42 run perpendicular to word lines 22 (shown in FIG. 2) and conform to the wafer surface resulting in a waveform-like topology running in both the digit line and word line directions. A second dielectric 45, such as oxide or nitride is now deposited, followed by an anisotropic etch to form vertical dielectric spacers 45.

Figure 5:
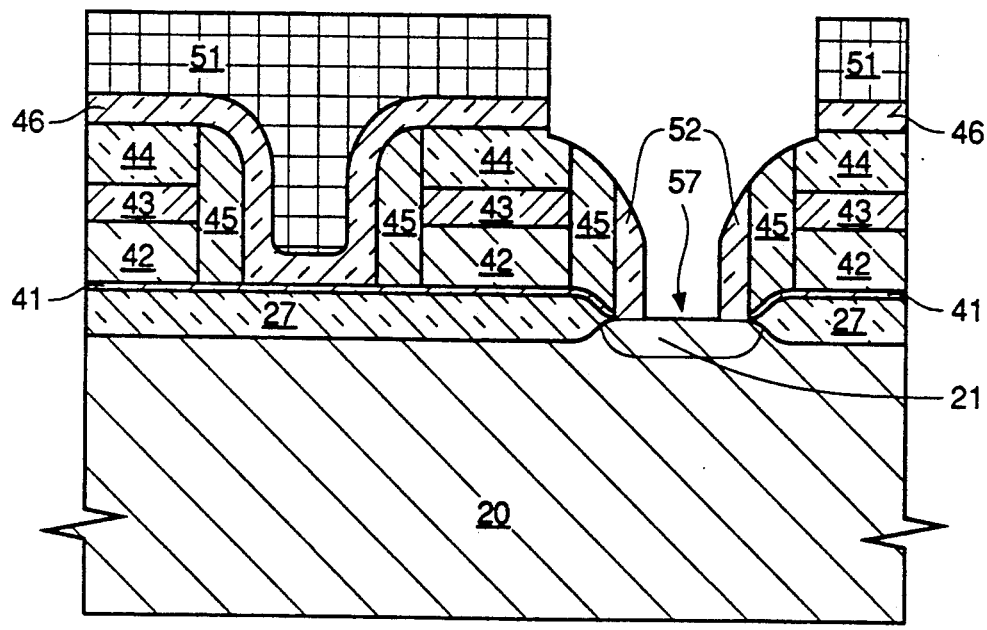
FIG. 5 is a cross-sectional view of the in-process wafer portion of FIG. 4 after conformal dielectric deposition, followed by a buried contact photo and etch.

As shown in FIG. 5, digit lines 42 and their subsequent isolation layers are then covered with dielectric 46, being oxide at a preferred thickness of 500 to 2000 angstroms preferably by CVD. Subsequently, a buried contact 57, self-aligned to digit lines 42 by the presence of spacers 45, is located by covering all areas other than contact 57 location with photoresist 51. After applying an appropriate photomask, a buried contact anisotropic etch on the exposed dielectric creates additional spacers 52 and provides an opening to locate contact 57.

Up to this point, process flow has followed that of an array comprising conventional stacked capacitor cells. From this point forward, the process is unique to an array having mushroom-type storage capacitors.

Figure 6:
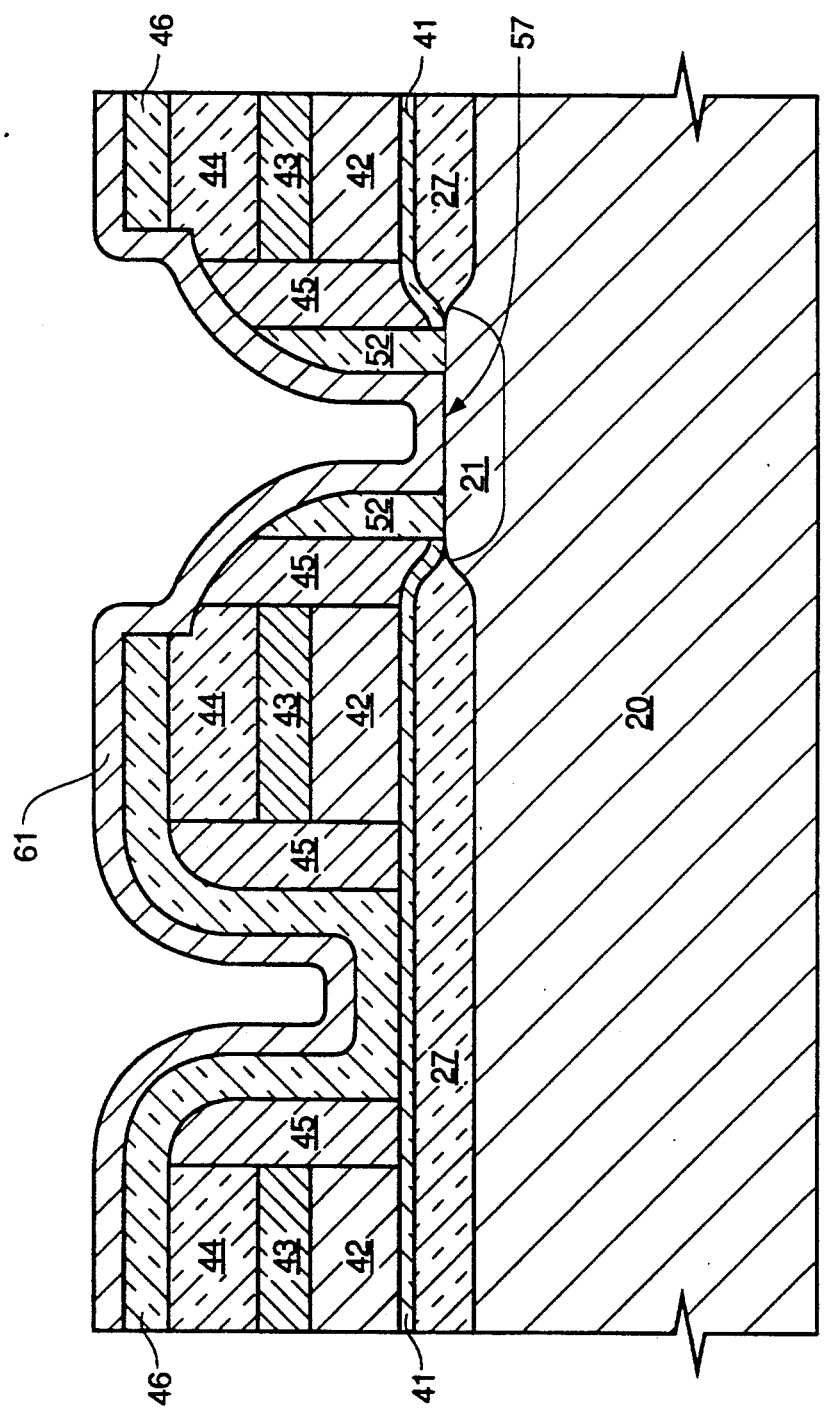
FIG. 6 is a cross-sectional view of the in-process wafer portion of FIG. 5 following a photoresist strip, and a blanket deposition of conformal poly.

As shown in FIG. 6, the photoresist 51 (of FIG. 5) has been stripped and a conformal poly layer 61 is deposited, preferably by low temperature deposition, over the entire array surface and couples to active area 21 via buried contact 57. Using low temperature deposition causes poly layer 61 to have a rugged textured surface that potentially doubles the surface area of poly layer 61. Following deposition poly layer 61 is doped to the desired conductivity type (p-type or n-type).

Figure 7:
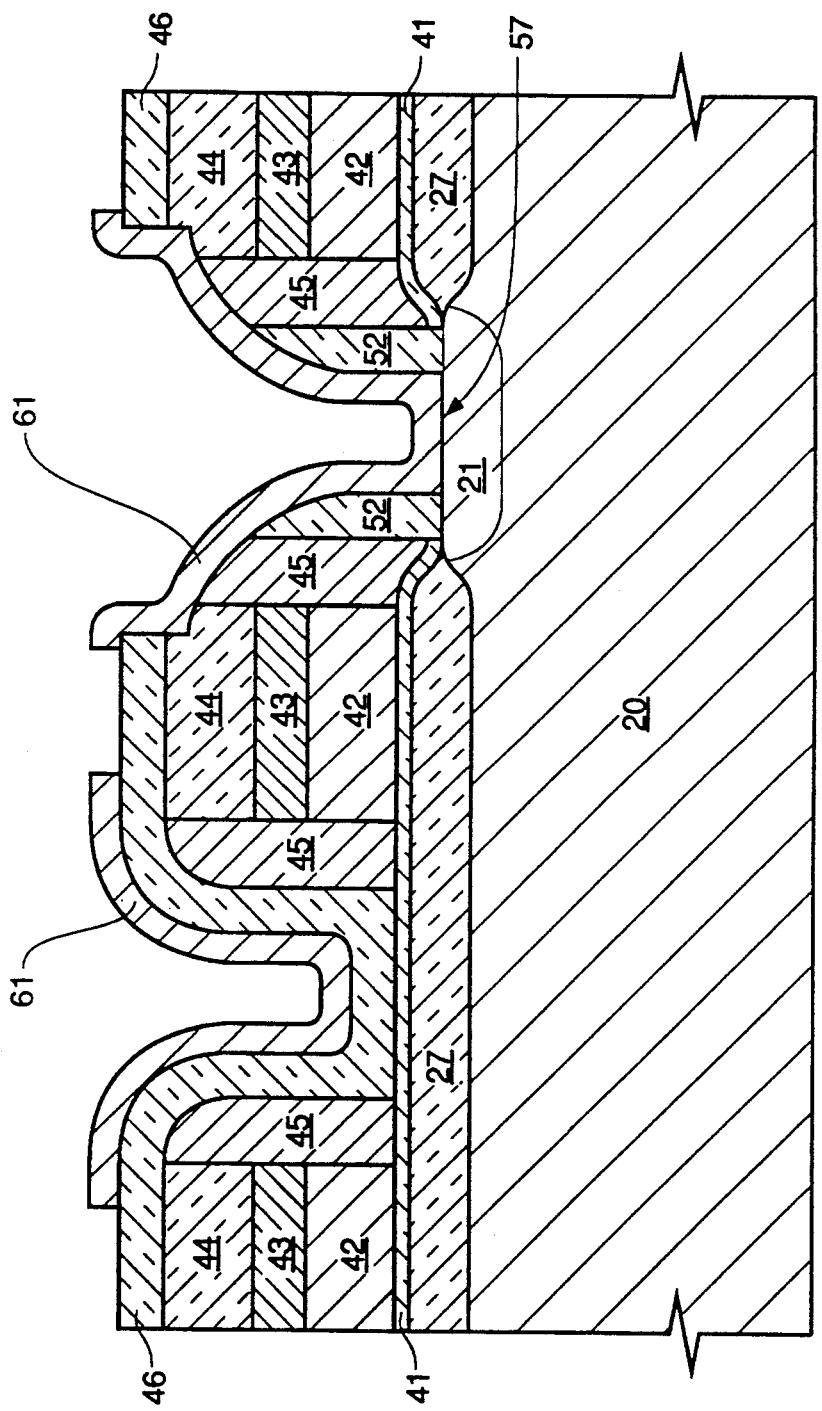
FIG. 7 is a cross-sectional view of the in-process wafer portion of FIG. 6 following doping and patterning of a portion of a poly storage node.

As shown in FIG. 7, poly layer 61 is patterned to serve as a portion of a storage node plate of the mushroom cell storage capacitor. Poly plate 61 extends over an adjacent poly word line (the word line is not shown as it runs parallel to the cross-sectional view of FIG. 7) and continues to the next adjacent word line. Plate 61 conforms to the two perpendicular waveform-like topology (created after digit line formation) which run in both the word lines and the digit lines directions.

Figure 8:
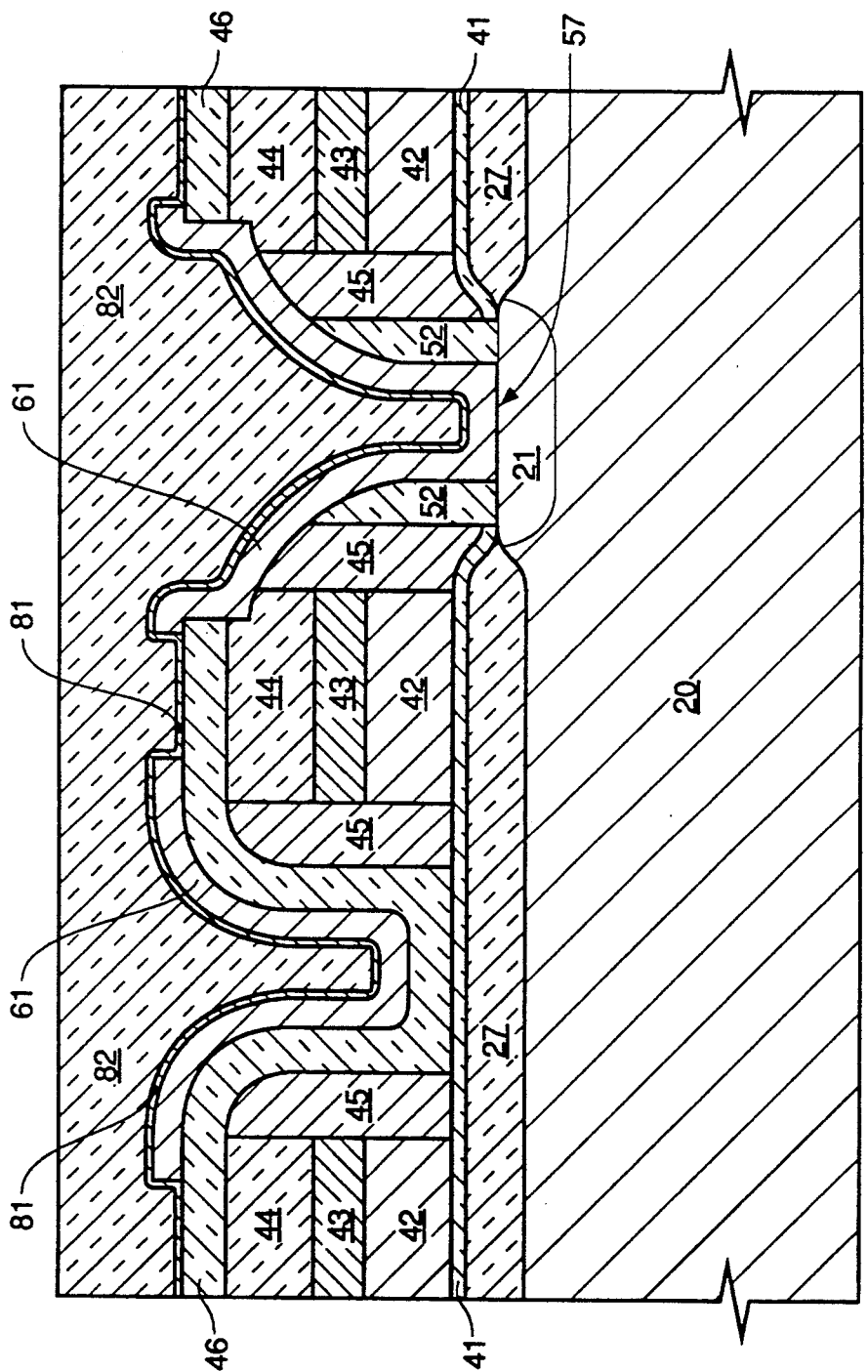
FIG. 8 is a cross-sectional view of the in-process wafer portion of FIG. 7 after depositions of conformal nitride and oxide.

As shown in FIG. 8, a conformal layer of nitride 81 is deposited over the array surface followed by deposition of oxide 82 (preferably Teos) that conforms to and planarizes the array surface.

Figure 9:
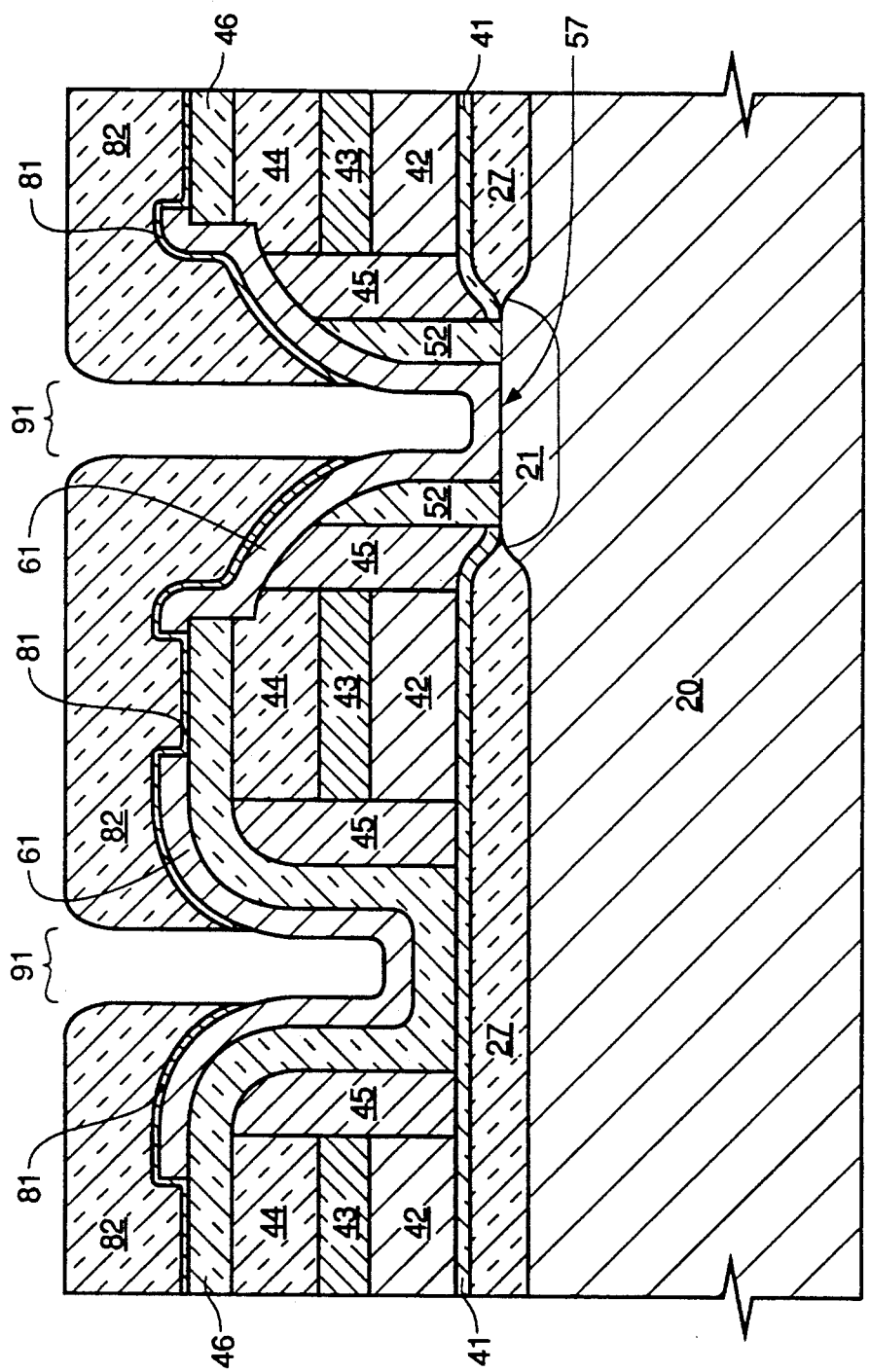
FIG. 9 is a cross-sectional view of the in-process wafer portion of FIG. 8 after a via-hole has been opened.
Figure 10:
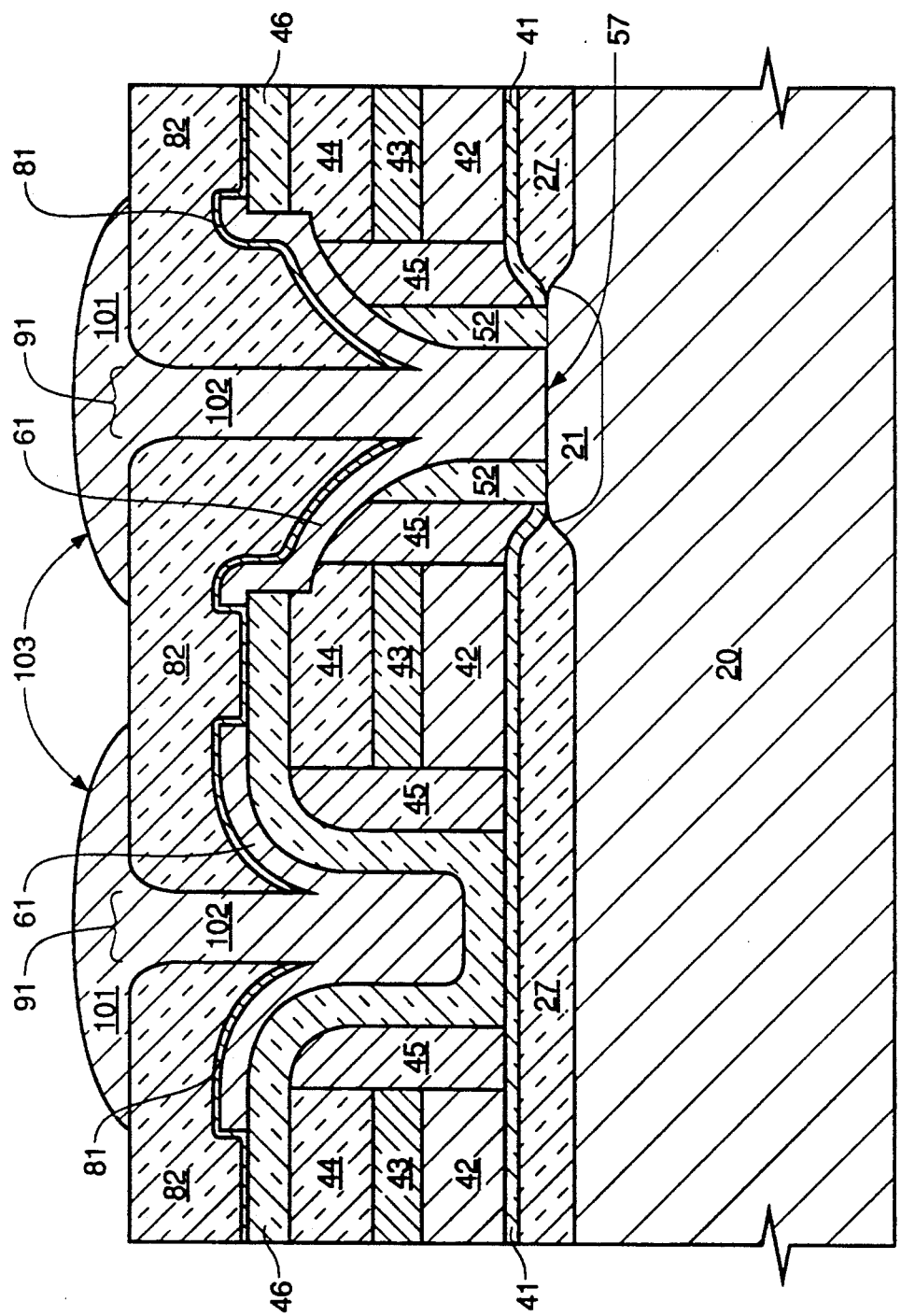
FIG. 10 is a cross-sectional view of the in-process wafer portion FIG. 9 following a deposition of selective polysilicon.

As shown in FIG. 9, a via-hole 91 is masked and etched opened to expose poly plate 61 at a inner base of poly 61's V-shaped cross-section. Via-hole 91 is utilized in a subsequent deposition of selective poly 101 as shown in FIG. 10. Deposition of selective poly 101 fills the via-hole creating a poly stem 102 in a vertical direction and continues to grow laterally on top of oxide 82 thereby forming a hemisphere or mushroom shaped poly structure. Mushroom-shaped poly structure 101 combines physically with V-shaped poly 62 through stem poly 102 to create a completed storage node cell plate 103 having a mushroom extended V-shaped cross-section.

Figure 11:
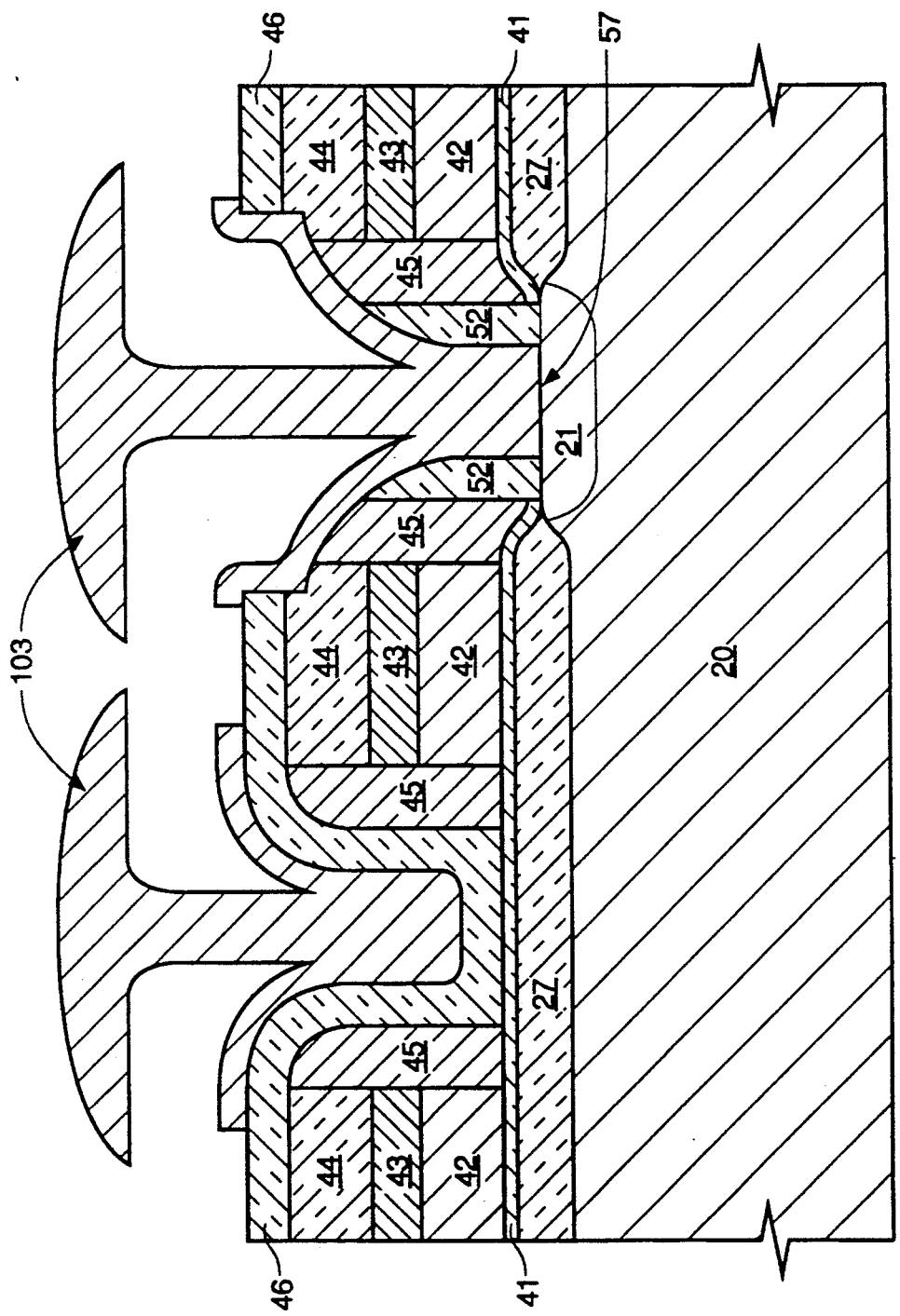
FIG. 11 is a cross-sectional view of the in-process wafer portion FIG. 10-following etching of oxide and nitride.

As shown in FIG. 11, oxide 82 and nitride 81 (seen in FIG. 10) are removed by isotropic etches such as a wet oxide etch followed by a wet nitride etch. Cell plate 103 is now exposed in preparation for process steps shown in FIG. 12 for completing a storage node cell.

Figure 12:
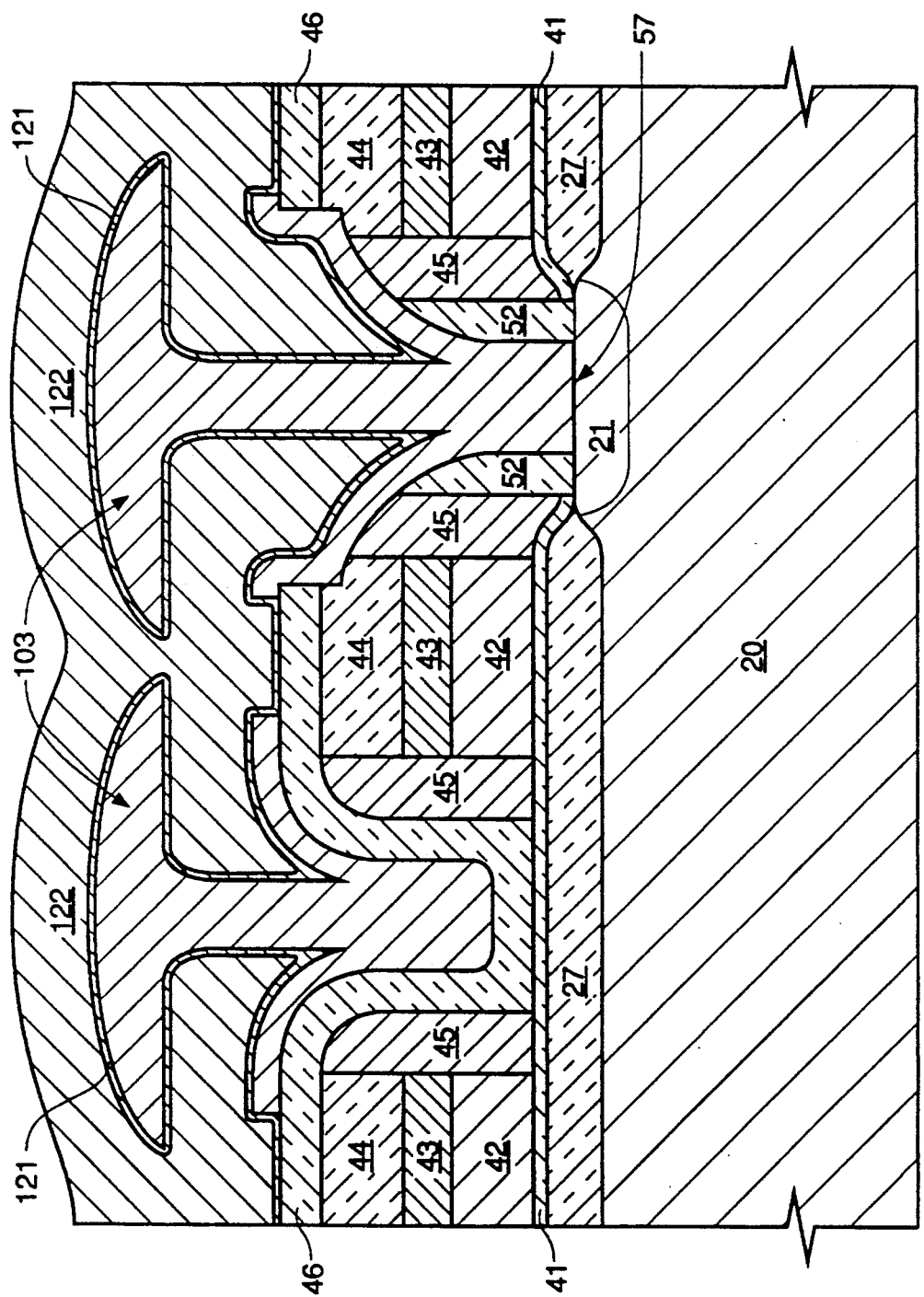
FIG. 12 is a cross-sectional view of the in-process wafer portion of FIG. 11 following blanket depositions of conformal nitride and poly.
Figure 3:
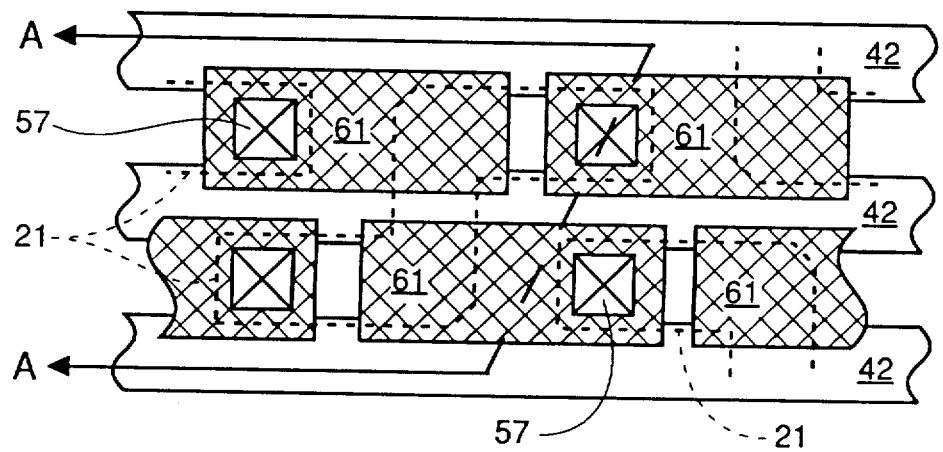

As shown in FIG. 12, a dielectric layer of nitride 121 is deposited that conforms to poly plate 103. Nitride 121 serves as a capacitor dielectric for the mushroom cell. Although nitride 121 is selected as the capacitor dielectric in the preferred embodiment any material having a high dielectric constant such as Ta2O5 or SrTiO3 could be used. Following nitride 121 deposition, a blanket deposition of conformal poly 122 is deposited. Poly plate 103 and poly 122 are conductively doped either n-type or p-type depending on the conductivity type desired for active area 21. Poly 122 now serves as a top poly capacitor cell plate of the mushroom storage capacitor which also becomes a common cell plate to all mushroom storage capacitors in the array.

With the unique shape of poly plate 103 along with top poly capacitor cell plate 122 that envelops plate 103, substantial capacitor plate surface area is gained at the storage node. Since capacitance is mainly effected by the surface area of a capacitor's cell plates the additional area gained by a 3-dimensional mushroom cell structure can provide an additional 200% or more increase in capacitance over that of a conventional STC capacitor, without more space than that required for defining a stacked capacitor storage cell. Also due to the lateral growth of mushroom shaped poly structure 101, spacing between adjacent storage nodes can be less than a critical resolution dimension of a given lithographic technology. Higher density for a given capacitance is possible as a smaller cell area is realized.

It is to be understood that although the present invention has been described with reference to a preferred embodiment, various modifications, known to those skilled in the art, may be made to the structures and process steps presented herein without departing from the invention as recited in the several claims appended hereto.

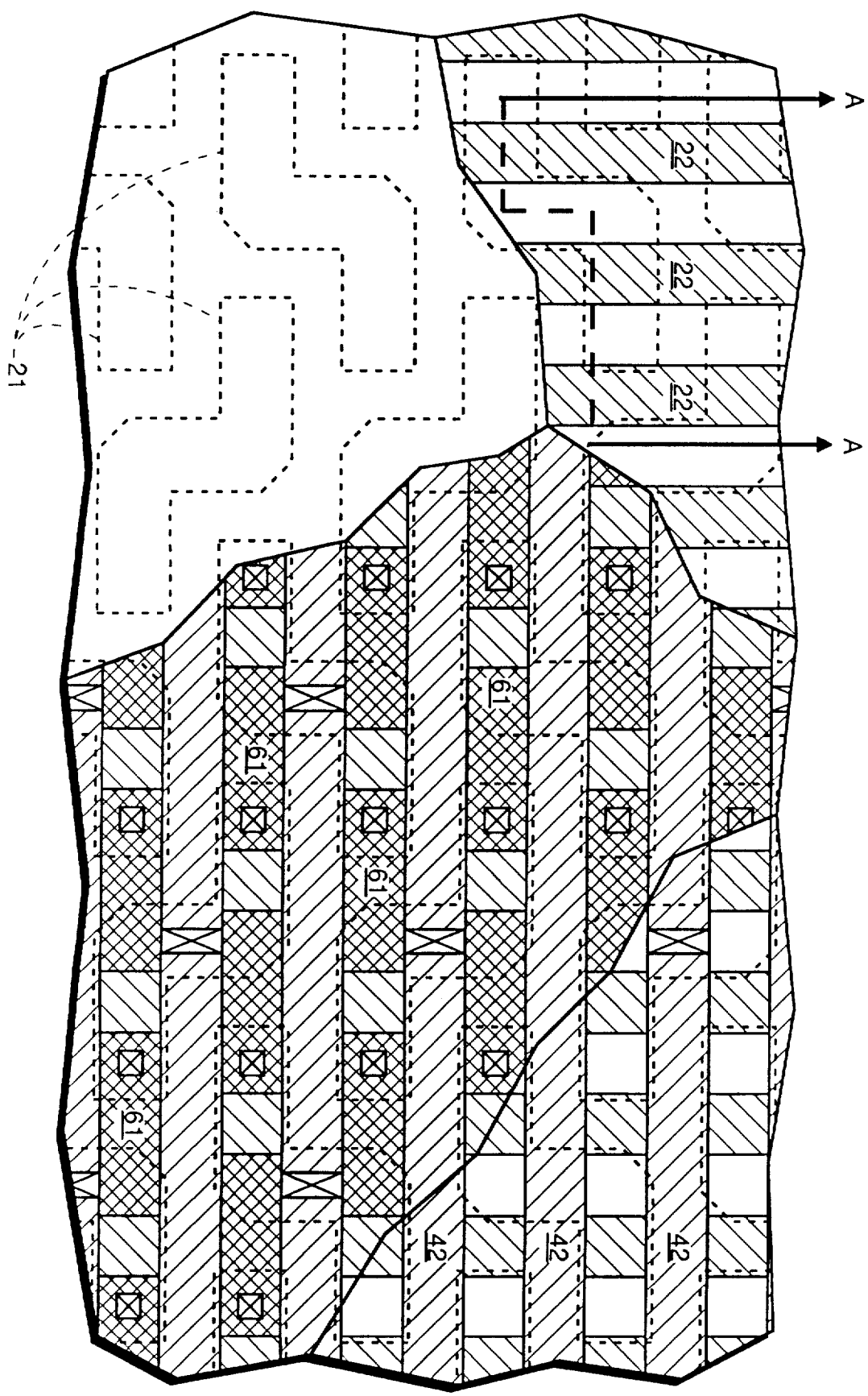

We claim:

1. A DRAM memory array constructed on a silicon substrate, said memory array comprising:

a plurality of active areas arranged in parallel interdigitated rows and parallel non-interdigitated columns, said active areas separated by isolation means, each of said active areas having a digit line junction, and a storage node junction;

a plurality of parallel conductive word lines aligned along said rows such that a digit line junction and a storage node junction within each active area are bridged by a word line, each word line being insulated from associated active areas by a gate dielectric layer;

a plurality of parallel conductive digit lines, aligned along said columns such that a digit line makes electrical contact with each digit line junction within a column, said digit lines running perpendicular to and over said word lines forming a 3-dimensional, waveform-like topology, said digit and word lines electrically separated from one another by isolation means; and at least one storage capacitor for each active area, each capacitor having a storage node plate that is in electrical contact with its associated active area and a cell plate that is common to the entire array, each storage node plate being insulated from said cell plate by a capacitive dielectric layer and having a mushroom extended V-shaped cross-section.

2. The memory array of claim 1, wherein said capacitor comprises:

a conductively-doped first polysilicon layer, said first polysilicon layer conforming to said waveform-like topology having a plurality of peaks and valleys, said first polysilicon layer forming a V-shaped component having first and second ends, said first polysilicon layer making contact to said storage node junction at said first end with said second end being isolated from an adjacent active area by thick oxide;

a conductively doped second polysilicon layer attaching to said first polysilicon layer, thereby extending said first polysilicon V-shaped component into a mushroom extended V-shaped component, thereby forming said storage node plate;

an insulation layer of said capacitator dielectric being adjacent to said storage node plate and coextensive therewith except at regions for said contact at said first end and said isolation at said second end; and a conductively-doped third polysilicon layer forming said cell plate, said cell plate having upper and lower surfaces and being adjacent to said capacitor dielectric layer and coextensive therewith.

3. A structure as recited in claim 2, wherein said first and said second polysilicon have a rugged, textured surface.

* * * * *

UNITED STATES PATENT AND TRADEMARK OFFICE
CERTIFICATE OF CORRECTION

PATENT NO. : 5,089,986
DATED : February 18, 1992
INVENTOR(S) : Gurtej S. Sandhu et al It is certified that error appears in the above-identified patent and that said Letters Patent is hereby corrected as shown below:

The drawing sheets, consisting of Figs 1 and 3, should be deleted to be replaced with the drawing sheets, consisting of Figs. 1 and 3, as shown on the attached pages.

Signed and Sealed this

Thirteenth Day of July, 1993

Attest:

MICHAEL K. KIRK

*Attesting Officer*    *Acting Commissioner of Patents and Trademarks*